(12) United States Patent
Robinson

(10) Patent No.: US 10,657,060 B1
(45) Date of Patent: May 19, 2020

(54) PREFETCHING PARTIAL BITSTREAMS

(71) Applicant: Xilinx, Inc., San Jose, CA (US)

(72) Inventor: David Robinson, Loanhead (GB)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 16/224,045

(22) Filed: Dec. 18, 2018

(51) Int. Cl.
*G06F 13/00* (2006.01)
*G06F 12/0862* (2016.01)
*G06F 15/78* (2006.01)
*H03K 19/17756* (2020.01)

(52) U.S. Cl.
CPC ...... *G06F 12/0862* (2013.01); *G06F 15/7867* (2013.01); *H03K 19/17756* (2013.01); *G06F 2212/6022* (2013.01)

(58) Field of Classification Search
CPC ............ G06F 12/0862; G06F 15/7867; G06F 15/7882; G06F 2212/6022; H03K 19/17756
See application file for complete search history.

(56) References Cited

U.S. PATENT DOCUMENTS

| | | | | |
|---|---|---|---|---|
| 9,183,339 B1* | 11/2015 | Shirazi | ............... | G06F 17/5054 |
| 10,084,452 B2* | 9/2018 | Obayashi | ......... | H03K 19/17776 |
| 10,122,883 B2* | 11/2018 | Yamamoto | ....... | H03K 19/17748 |
| 2004/0117755 A1* | 6/2004 | Blodget | .............. | G06F 15/7867 |
| | | | | 716/117 |
| 2006/0248317 A1* | 11/2006 | Vorbach | .............. | G06F 15/7867 |
| | | | | 712/221 |
| 2017/0315815 A1* | 11/2017 | Smith | ................... | G06F 9/3017 |
| 2017/0371660 A1* | 12/2017 | Smith | ................. | G06F 9/30043 |
| 2018/0143860 A1* | 5/2018 | Dasu | ..................... | G06F 9/4843 |

* cited by examiner

*Primary Examiner* — Sean D Rossiter
(74) *Attorney, Agent, or Firm* — Fish and Richardson

(57) ABSTRACT

Methods, systems, and apparatus, including computer programs encoded on computer storage media, for performing a partial reconfiguration of a partially reconfigurable programmable logic device. One of the methods includes providing, to an external memory device storing partial reconfiguration data, a first modified buffer offset. Before receiving partial reconfiguration data at the first modified buffer offset from the external memory, a first portion of prefetched data stored in local buffer memory is written to a configuration space of the partially reconfigurable device. When a first portion of data at the first modified buffer offset is received from the external memory device, the first portion of data at the first modified buffer offset is written to the configuration space of the partially reconfigurable device.

18 Claims, 4 Drawing Sheets

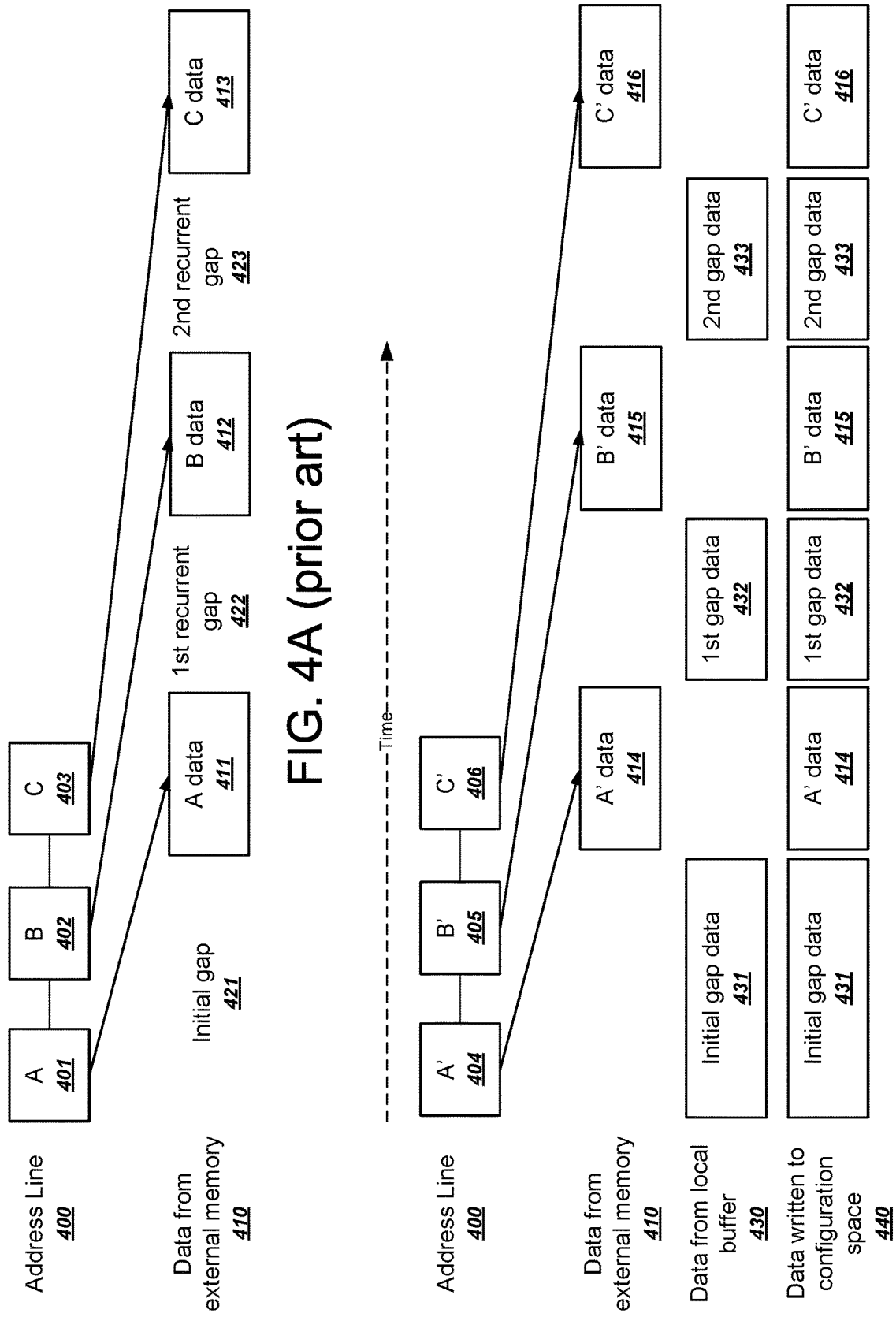

PREFETCHING PARTIAL BITSTREAMS

TECHNICAL FIELD

This specification relates to partially reconfigurable programmable logic devices.

BACKGROUND

Programmable logic devices are hardware devices whose circuitry can be reconfigured after being manufactured. Programmable logic devices typically include one or more integrated circuits (ICs) that can be integrated into a larger overall system.

A programmable logic device can be reconfigured by writing configuration data into internal configuration memory that defines how programmable elements of the device should function. For example, an FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, and delay lock loops (DLLs), to name just a few examples. Another type of programmable logic device is a complex programmable logic device, or CPLD. A CPLD includes two or more "function blocks" connected together and connected to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

Partially reconfigurable devices (PRDs) are programmable logic devices that allow a portion of the circuitry to be reconfigured while other portions of the circuitry continue to operate according to a previous configuration. PRDs provide the ability to rapidly adapt the configuration of the device in applications where low-latency reactions are important. Such applications include image processing, wireless networking, information retrieval, telecommunications, flight controls, and robotics.

The functionality of a PRD is controlled by data bits written to a configuration space of the device from external memory. Naturally, the speed at which the partial reconfiguration data can be read from the external memory is one of the biggest limiting factors for how quickly a PRD can be reconfigured.

SUMMARY

This specification describes how a system can increase the effective memory bandwidth when performing a partial reconfiguration of a partially reconfigurable device. To do so, the system can prefetch, into local buffer memory, data that will be used to reconfigure the device while the device is unable to receive data from external memory due to initial setup delays or bus loss to other bus users.

In general, one innovative aspect of the subject matter described in this specification can be embodied in methods of performing a partial reconfiguration of a partially reconfigurable programmable logic device, in which the methods include the actions of detecting an event that triggers a partial reconfiguration process; providing, to an external memory device storing partial reconfiguration data, a first modified buffer offset; before receiving partial reconfiguration data at the first modified buffer offset from the external memory, writing, to a configuration space of the partially reconfigurable device, a first portion of prefetched data stored in local buffer memory; receiving, from the external memory device, a first portion of data at the first modified buffer offset; and writing, to the configuration space of the partially reconfigurable device, the first portion of data at the first modified buffer offset. Other embodiments of this aspect include corresponding computer systems, apparatus, and computer programs recorded on one or more computer storage devices, each configured to perform the actions of the methods.

The foregoing and other embodiments can each optionally include one or more of the following features, alone or in combination. In particular, one embodiment includes all the following features in combination. The actions include providing, to the external memory device, a second modified buffer offset; before receiving partial reconfiguration data at the second modified buffer offset from the external memory, writing, to a configuration space of the device, a second portion of prefetched data stored in local buffer memory; receiving, from the external memory device, a first portion of data at the first modified buffer offset; and writing, to the configuration space of the device, the first portion of data at the first modified buffer offset. The first portion of prefetched data occurs at a beginning of the partial reconfiguration data. A first size of the first portion of prefetched data is larger than a second size of the second portion of prefetched data. Providing the first modified buffer offset occurs after a plurality of reads to external memory have been performed. A first size of the first portion of prefetched data is the same as a second size of the second portion of prefetched data. The second modified buffer offset is based on an amount of time that the programmable logic device will lose ownership of a bus to the external memory after reading the first portion of data at the first modified buffer offset. A total size of the partial reconfiguration data is larger than a size of the local buffer memory. Writing the first portion of prefetched data stored in local buffer memory occurs in a gap between requesting the first modified buffer offset and receiving the first portion of data at the first modified buffer offset.

Particular embodiments of the subject matter described in this specification can be implemented so as to realize one or more of the following advantages. A partially reconfigurable device can use prefetching to increase the memory bandwidth during a partial reconfiguration. This reduces the latency of the partial reconfiguration process and allows the partial reconfiguration process to be performed faster, which makes the device more responsive and suitable for a wider variety of low-latency applications. In addition, these speed and bandwidth advantages can be achieved without increasing the size, complexity, or cost of the device.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 4A is a waveform chart that illustrates the gaps that occur due to requesting partial reconfiguration data from an external memory device using a prior art technique with no prefetching.

FIG. 4B is a waveform chart that illustrates how the memory bandwidth can be increased using prefetched data.

Like reference numbers and designations in the various drawings indicate like elements.

DETAILED DESCRIPTION

Figure 1:
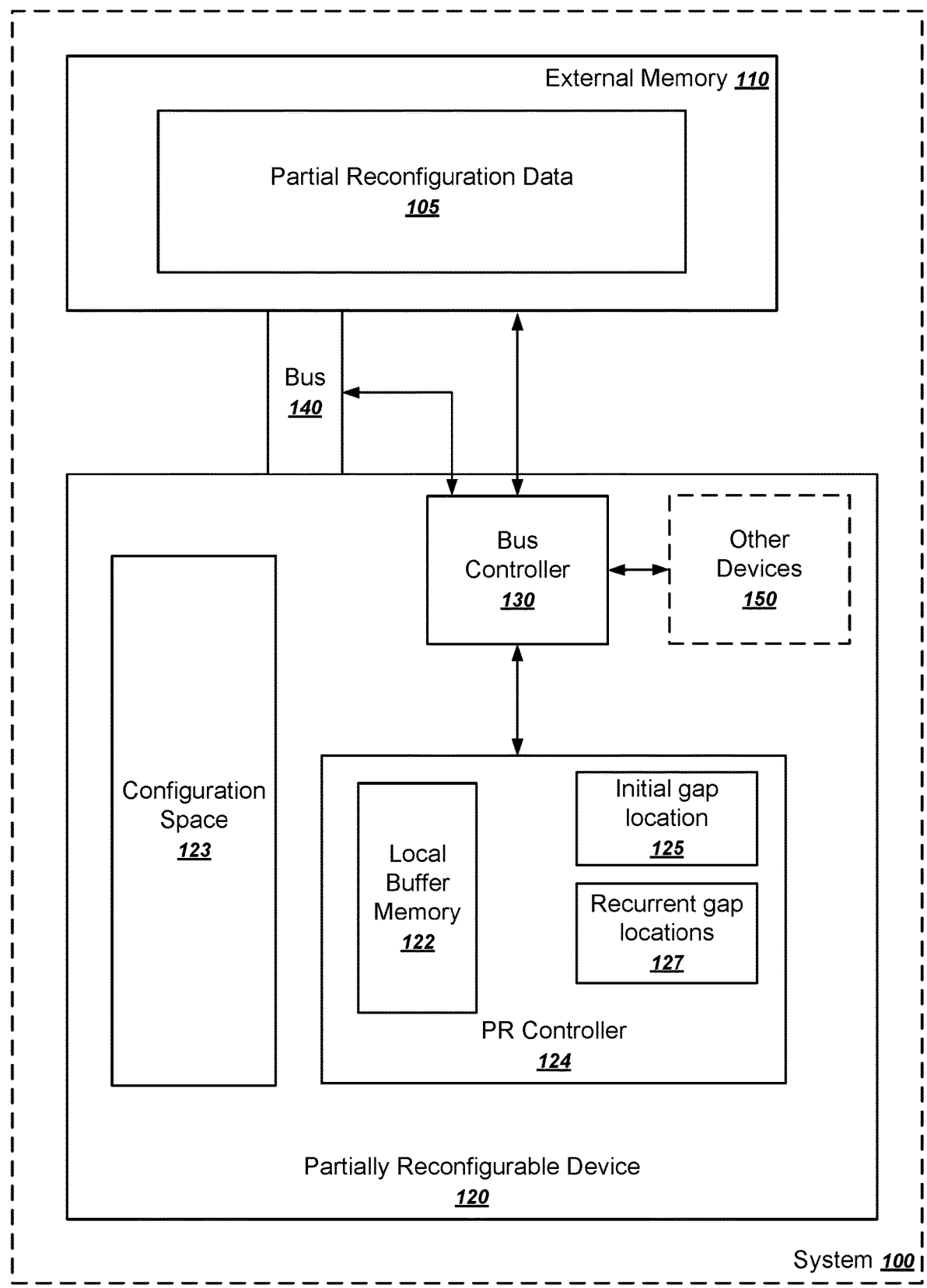
FIG. 1 is a diagram of an example system.

FIG. 1 is a diagram of an example system 100. The system 100 includes an external memory 110 that stores partial reconfiguration data 105 that can be used to reprogram the partially reconfigurable device 120. The system 100 is an example of a system in which the techniques described below can be implemented. For example, the system 100 can be a circuit board on which the components illustrated in FIG. 1 are mounted. Alternatively or in addition, one or more components of the system 100 can be implemented as a system-on-a-chip or another integrated electronics system.

The partially reconfigurable device 120 is a programmable logic device having one or more integrated circuits. For example, the partially reconfigurable device can have multiple ICs coupled together with integrated communications channels, e.g., using silicon interposers, interconnect bridges, or die stacking.

The partially reconfigurable device 120 has a partial reconfiguration (PR) controller 124 that is configured to coordinate the partial reconfiguration process. The partial reconfiguration process involves the PR controller 124 communicating with a bus controller 130 in order to retrieve partial reconfiguration data 105 from the external memory 110. Reading data from the external memory 110 can include providing an address to the external memory 110 through the bus controller 130 or another channel and receiving data over the bus 140 between the external memory 110 and the partially reconfigurable device 120. The PR controller 124 can then coordinate writing the partial reconfiguration data 105 to a configuration space 123 of the partially reconfigurable device 120. For example, the PR controller 124 can push the data to an internal configuration access port (ICAP).

However, the PR controller 124 may not be the exclusive owner of the connection to the external memory 110. The partially reconfigurable device 120 may have one or more other devices 150 that compete with the PR controller 124 for access to the external memory 110. Therefore, it is expected for there to be regular interruptions of reading data over the bus 140 from the external memory 110. Furthermore, the period of the interruptions is assumed to be a known property of the system 100 or one that can be determined empirically. In this specification, the term data gap will be used to refer to the period during which requested data is delayed received from the external memory either due to initial startup latency or due to recurrently or periodically relinquishing the bus to other devices.

The partially reconfigurable device 120 also has an integrated local buffer memory 122. This means that the partially reconfigurable device 120 can read from the local buffer memory 122 much faster than it can read from the external memory 110. In addition, the partially reconfigurable device 120 need not compete with any other devices, e.g., the other devices 150, for access to the local buffer memory 122.

The external memory 110 can be any appropriate volatile or non-volatile storage subsystem. For example, the external memory can be volatile memory, e.g., static memory cells, as in FPGAs and some CPLDs; or non-volatile memory, e.g., FLASH memory, as in some CPLDs, or in any other appropriate type of memory cell.

The external memory 110 stores partial reconfiguration data 105 that is used to perform a partial reconfiguration of the partially reconfigurable device 120. Typically, the partial reconfiguration data 105 is much larger than the local buffer memory 122 of the partially reconfigurable device 120. This necessitates the coordination with the external memory 110 in order to perform the partial reconfiguration process.

In this specification, a bitstream will refer to an ordered set of partial reconfiguration data. All portions of the bitstream can be stored in an external memory, while some portions of the bitstream will also be stored in local buffer memory. A portion of data in local buffer memory can be described as coming before or after another portion of data in the external memory due to the ordering of the data in the bitstream.

In order to increase the effective bandwidth of reading from the external memory 110, the PR controller 124 can prefetch data into the local buffer memory 122. In this context, prefetching data means that data is loaded into the local buffer memory 122 before the occurrence of an event that triggers performing the partial reconfiguration process.

To support the prefetching process, the PR controller 124 can obtain or compute an initial gap location 125 and one or more recurrent gap locations 127. The initial gap location can represent the initial latency of performing an initial request to the external memory 110. The recurrent gap locations 127 can represent recurring latency due to the PR controller 124 losing ownership of the bus 140 as a result of the bus controller 130 affording ownership of the bus 140 to other competing devices on a recurring or periodic basis. The recurrent gaps may but need not be equal or similar in size. In addition, the recurrent gaps may but need not be exactly periodic. In some implementations, the size of the initial gap and the recurrent gaps are known at system design time. In some other implementations, the sizes and locations of the gaps are determined empirically.

Due to the cost of initializing the connection to the external memory, the length of the initial data gap is typically significantly larger than any of the recurrent data gaps.

This example assumed prefetching data from the beginning of the partial reconfiguration data. Alternatively or in addition, similar techniques can be used to prefetch from the middle or at the end of the partial reconfiguration data. This is explained in more detail below.

Figure 2:
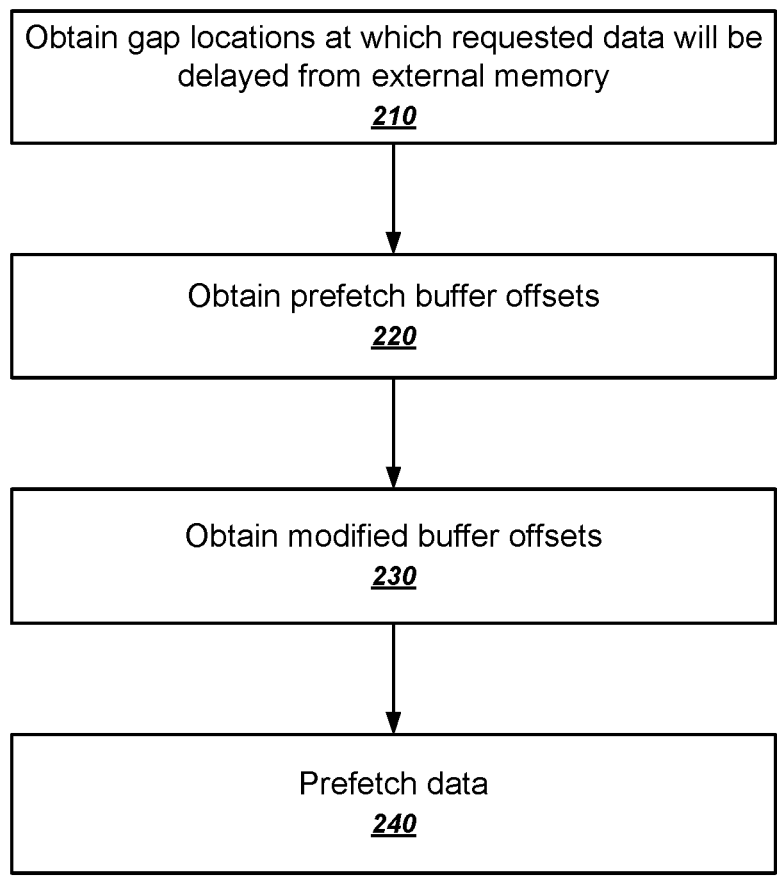
FIG. 2 is a flowchart of an example process for prefetching data to fill data gaps during partial reconfiguration.

FIG. 2 is a flowchart of an example process for prefetching data to fill data gaps during partial reconfiguration. The example process can be performed by one or more of a number of different devices at a number of different times prior to the partial reconfiguration process being triggered. For example, the example process can be performed at compile time and the prefetched data loaded into the local buffer memory as part of an initial bit stream for a PR device. As another example, the example process can be performed by a CPU, a PR controller of a PR device, or another computing device that is coupled to the PR device. In addition, some steps of the example process can be performed by different devices. For convenience, the example process will be described as being performed by a device programmed in accordance with the techniques described in this specification.

The device obtains data gap locations at which requested data will be delayed from the external memory (210). As described above, the data gaps can include an initial data gap that occurs due to initial startup latency of reading from the external memory as well as recurrent data gaps that occur due to the PR controller losing ownership of a data bus.

The device can represent the data gap locations in any appropriate format or unit. For example, each gap can be represented by a start and an end, a start and a length, an end and a length, or some combination of these. The device can use any appropriate unit for representing the data gap boundaries, e.g., clock cycles or some measurement of time, e.g., microseconds or milliseconds.

The data gap locations can be precomputed by a configuration system, e.g., at compile time, or the data gap locations can be computed by the device at run time. For example, a configuration computer system can precompute the data gap locations and provide the precomputed data gap locations to the device.

In some implementations, the data gaps are computed using a memory burst length that represents how long a burst from memory will last. The initial gap length, the memory burst length, and the recurrent gap lengths provide all the information needed to precompute the locations of all data gaps. For example, the device or a configuration system can first add the memory burst to the initial data gap and then repeatedly add each recurrent data gap and a subsequent memory burst in order to compute the locations of all the data gaps.

The device obtains prefetch buffer offsets (220). Each segment of prefetched data is designed to fill a data gap in the sequence of memory requests.

As explained above, the device can reduce or remove the data gaps using prefetched data that is read from local buffer memory. Thus, the size of each portion of prefetched data will depend on the length of each gap and the amount of data that could have been read from external memory in the same amount of time or in the same number of clock cycles.

Thus, if the initial data gap lasts for 500 clock cycles, the first portion of prefetched data can have a size that is less than or equal to the amount of data that could be read from memory during those 500 clock cycles. Similarly, if each recurrent gap lasts for 256 clock cycles, each subsequent portion of prefetched data can have a size that is less than or equal to the amount of data that could be read from memory during those 256 clock cycles. Note that a portion of prefetched data to fill a gap can be larger than the maximum memory burst length. This can happen, for example, if multiple other devices are expected to occupy the bus before the PR controller regains ownership. For example, if three other devices are expected to occupy the bus during a particular gap, the size of the prefetched data can be three times the size of the maximum memory burst.

The sizes of prefetched data for the recurrent gaps may, but need not, be the same. For example, a configuration system can determine that a particular memory device has predictable, but non-uniform recurrent gaps and can compute the prefetched data portions accordingly.

In addition, the size of the initial data gap can be equal to the size of one or more recurrent gaps. One situation in which this arises is when filling data gaps in the middle or the end of the partial reconfiguration data. This is described in more detail below.

The prefetch buffer offsets can then be computed using the sizes of the portions of prefetched data as well as the sizes of each memory burst.

Thus, the first prefetch buffer offset can specify the start of the initial memory offset for the external memory buffer that holds the partial reconfiguration data.

The second and subsequent prefetch buffer offsets can be computed by adding, to the last prefetch buffer offset, a size of a memory burst plus a size of the last portion of prefetched data.

The device obtains modified buffer offsets (230). Each modified buffer offset is a memory address that should be requested from the external memory.

Normal buffer offsets can be computed by simply adding, to an initial offset, the amount of data read from external memory on each memory request. For example, if 256 bytes of data can be obtained from one memory request, normal buffer offsets can be computed simply by continually adding 256 to the initial offset for the external memory buffer that holds the partial reconfiguration data.

On the other hand, computing modified buffer offsets requires taking into account the size of each memory request as well as the sizes of the data that will be prefetched to fill each data gap.

Thus, the first modified buffer offset can be computed as the initial memory offset plus the size of the first portion of prefetched data that corresponds to the initial data gap.

The second and subsequent modified buffer offsets can be computed by adding, to the last modified buffer offset, a size of the last memory burst plus a size of the last portion of prefetched data.

When prefetching for the middle or end of the partial reconfiguration data, the modified buffer offsets may not occur until the middle or the end of the sequence of memory requests. In other words, the sequence of memory requests can first include a number of normal buffer offsets that are simply increments of the memory burst size. Thus, the first modified buffer offset need not be near the beginning of the partial reconfiguration data.

The device prefetches data (240). The device can iterate over the prefetch buffer offsets, and for each prefetch buffer offset, load data, e.g., from external memory, according to the size of the corresponding portion of the prefetched data. The device can then store the data in local buffer memory for consumption upon an even that triggers a partial reconfiguration.

Note that while the steps 220 and 230 are illustrated as occurring in serial, in practice these steps can be interleaved. In other words, the system can compute the first prefetch buffer offset, then the first modified buffer offset, then the second prefetch buffer offset, then the second modified buffer offset, and so on.

Moreover, step 240 can also be interleaved with one or both of steps 220 and 230. In other words, the system can compute the first prefetch buffer offset and prefetch the first portion of prefetch data, then compute the first modified buffer offset, then compute the second prefetch buffer offset and load the second portion of prefetch data, compute the second modified buffer offset, and so on.

Figure 3:
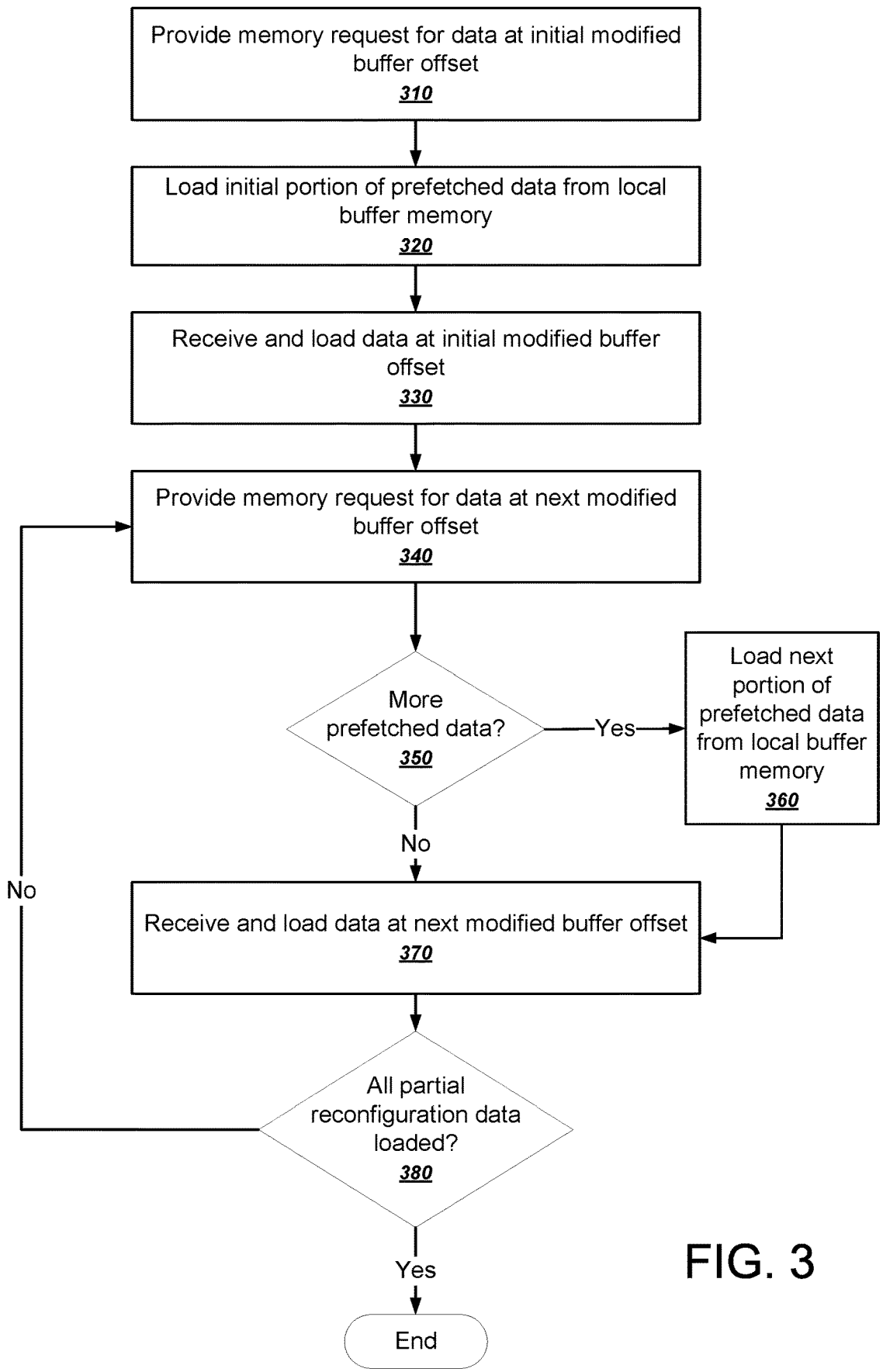
FIG. 3 is a flowchart of an example process for performing a partial reconfiguration using prefetched data.

FIG. 3 is a flowchart of an example process for performing a partial reconfiguration using prefetched data. The example process can be performed in response to the occurrence of an event that triggers the partial reconfiguration process. For convenience, the example process will be described as being performed by a device programmed in accordance with the techniques described in this specification.

The device provides a memory request for data at an initial modified buffer offset (310). The initial modified buffer offset is typically not the start of the external memory buffer, but rather a location in the bitstream after the size of the initial portion of prefetched data.

The device loads the initial portion of prefetched data from local buffer memory (320). This step typically occurs before a response from the external memory has been received. In other words, the device loads the prefetched data while waiting for the external memory to respond to the first memory request. The device can use the size computed for the initial portion of prefetched data and load the prefetched data from local buffer memory. To perform the partial reconfiguration, the device can write the prefetched data to a configuration space, e.g., by writing to an ICAP.

The device receives and loads data at the first modified buffer offset (330). In other words, the device eventually receives a first response from the external memory and loads the received data for the partial reconfiguration.

The device provides a memory request for data at the next modified buffer offset (340). As described above, each subsequent modified buffer offset effectively skips over data that has already been prefetched.

The device determines whether more prefetched data exists in the local buffer memory (350). In order to make this determination, the device can maintain a running total of the amount of data read from the local buffer memory and compare the running total to a size of data prefetched to the local buffer memory. When the running total exceeds the size, the device can determine that no more prefetched data exists in the local buffer memory.

If prefetched data remains, the device loads the next portion of prefetched data from local buffer memory (branch to 360). If not, the device stops attempting to load prefetched data from local buffer memory (branch to 370).

The device receives and loads data at the next modified buffer offset (370). The device receives another response from external memory and loads the received data for the partial reconfiguration.

The device determines whether all partial reconfiguration data has been loaded (380). If not, the device provides another memory request for the next modified buffer offset (branch to 340). If so, the process ends (branch to end).

For clarity, the steps in FIG. 3 has been illustrated as occurring in a well-defined order. However, in practice, some of the steps illustrated in FIG. 3 may be overlapping. For example, some devices do not need to wait to receive data before providing another address to the external memory device. The external memory device can queue the addresses and provide data as soon as it is available. Therefore, one or more modified buffer offsets may actually be provided to the external memory device before receiving any data. This is illustrated in FIGS. 4A-4B.

FIG. 4A is a waveform chart that illustrates the gaps that occur due to requesting partial reconfiguration data from an external memory device using a prior art technique with no prefetching.

When the address line 400 issues addresses A 401, B 402, and C 403, the device receives, on the data line 410 A data 411 after an initial gap 421, B data 412 after a first recurrent gap 422, and C data 413 after a second recurrent gap 423.

FIG. 4B is a waveform chart that illustrates how the memory bandwidth can be increased using prefetched data.

In FIG. 4B, instead of using addresses of original buffer offsets, the device uses modified buffer offsets A' 404, B' 405, and C' 406 that are computed to account for the portions of prefetched data stored in local buffer memory.

And instead of merely waiting for the data to be received from the external memory, the device receives initial gap data 431, which is data received from the local buffer memory 430 and immediately writes the initial gap data 431 to the configuration space 440.

The device then receives from the external memory the A' data 414 for the first modified buffer offset and writes the A' data 414 to the configuration space 440.

Notably, in the same amount of time that the prior art system would have written only the A data 411, the system that uses prefetching has written more than twice as much data to the configuration space because the prefetched initial gap data filled the initial gap 421.

After receiving the A' data 414, the device encounters the first recurrent gap 422. Instead of waiting for the B' data 415 to arrive, the device instead loads the first gap data 432 from the local buffer memory and writes the first gap data 432 to the configuration space. Thus, by the time the B' data 415 arrives, the device has filled the first recurrent gap 422 with the first gap data 432.

Similarly, during the second recurrent gap 423, the device can load and write the second gap data 433 to the configuration space while waiting for the C' data 416 to arrive from the external memory. As can be seen from the data written to the configuration space line 440, the gaps that were present in the prior art configuration have been reduced or removed entirely by using the prefetched data from the local buffer memory.

The examples in FIGS. 2-4 primarily described prefetching to fill gaps in the beginning of the partial reconfiguration data. However, with a few small modifications, the same techniques can be used to prefetch to fill gaps in the middle or the end of the partial reconfiguration data.

Prefetching for the middle or the end of the partial reconfiguration data can be preferable in some situations. This is because the fetch for reconfiguration data can begin at any point before the data is actually needed, but the data cannot pass into the configuration space until needed. This means that a certain amount of fetched data can be stored in the data path FIFOs queues before being used. Gaps caused by the initial latency and recurrent gaps will thus be removed due to the fact that the data consumer, e.g., the configuration space, does not consume data even though the producer, e.g., the external memory, is providing it. By the time the data is actually used, the gaps at the start will have been removed naturally. However, as only some of the partial reconfiguration data can reside in the data path, the recurrent gaps at the end of the bitstream will still be seen at the configuration port. By buffering the end of the bitstream instead, the gaps at the start can be allowed to decay naturally, and the gaps at the end managed by prefetched data stored in local buffer memory.

To perform the prefetching process for the middle or end of the partial reconfiguration data, the device can make the following modifications. First, the device can set the size of the data retrieved for the initial gap to be equal to the size of data retrieved for the recurrent gaps. In other words, when prefetching for the middle or end of the bitstream, because initial latency for the external memory will have already occurred, the gap for the first prefetched portion of data will be the same for all other portions of prefetched data.

Next, the device can determine the start location of the first modified buffer offset, and use normal buffer offsets before that point. In other words, the system can determine at what point in the sequence of memory requests the device should being to load prefetched data in the recurrent gaps in which data from the memory is delayed. To do so, the system can count backwards from the end of the bitstream using a size of the local buffer memory. Before that point, normal buffer offsets will be used, and after that point, modified buffer offsets will be used until the end of the bitstream or until the prefetched data from the local buffer memory is exhausted. Note that the start location might land in the middle of a memory burst. In that situation, the system can reduce the size of the last memory burst before the start location so that the prefetched data is used at the start location rather than being received from external memory.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program which may also be referred to or described as a program, software, a software application, an app, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e-book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and pointing device, e.g, a mouse, trackball, or a presence sensitive display or other surface by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain some cases, multitasking and parallel processing may be advantageous.

What is claimed:

1. A method of performing a partial reconfiguration of a partially reconfigurable programmable logic device, the method comprising:
    detecting an event that triggers a partial reconfiguration process;
    providing, to an external memory device storing partial reconfiguration data, a first modified buffer offset;
    before receiving partial reconfiguration data at the first modified buffer offset from the external memory, writing, to a configuration space of the partially reconfigurable device, a first portion of prefetched data stored in local buffer memory;
    receiving, from the external memory device, a first portion of data at the first modified buffer offset; and
    writing, to the configuration space of the partially reconfigurable device, the first portion of data at the first modified buffer offset.

2. The method of claim 1, further comprising:
    providing, to the external memory device, a second modified buffer offset;
    before receiving partial reconfiguration data at the second modified buffer offset from the external memory, writing, to a configuration space of the device, a second portion of prefetched data stored in local buffer memory;
    receiving, from the external memory device, a first portion of data at the first modified buffer offset; and
    writing, to the configuration space of the device, the first portion of data at the first modified buffer offset.

3. The method of claim 2, wherein the first portion of prefetched data occurs at a beginning of the partial reconfiguration data.

4. The method of claim 3, wherein a first size of the first portion of prefetched data is larger than a second size of the second portion of prefetched data.

5. The method of claim 2, wherein providing the first modified buffer offset occurs after a plurality of reads to external memory have been performed.

6. The method of claim 5, wherein a first size of the first portion of prefetched data is the same as a second size of the second portion of prefetched data.

7. The method of claim 2, wherein the second modified buffer offset is based on an amount of time that the programmable logic device will lose ownership of a bus to the external memory after reading the first portion of data at the first modified buffer offset.

8. The method of claim 1, wherein a total size of the partial reconfiguration data is larger than a size of the local buffer memory.

9. The method of claim 1, wherein writing the first portion of prefetched data stored in local buffer memory occurs in a gap between requesting the first modified buffer offset and receiving the first portion of data at the first modified buffer offset.

10. A system comprising:
    an external memory device configured to store partial reconfiguration data; and
    a partially reconfigurable programmable logic device configured to perform operations comprising:

detecting an event that triggers a partial reconfiguration process;

providing, to the external memory device storing partial reconfiguration data, a first modified buffer offset;

before receiving partial reconfiguration data at the first modified buffer offset from the external memory, writing, to a configuration space of the partially reconfigurable device, a first portion of prefetched data stored in local buffer memory;

receiving, from the external memory device, a first portion of data at the first modified buffer offset; and writing, to the configuration space of the partially reconfigurable device, the first portion of data at the first modified buffer offset.

11. The system of claim 10, wherein the operations further comprise:

providing, to the external memory device, a second modified buffer offset;

before receiving partial reconfiguration data at the second modified buffer offset from the external memory, writing, to a configuration space of the device, a second portion of prefetched data stored in local buffer memory;

receiving, from the external memory device, a first portion of data at the first modified buffer offset; and writing, to the configuration space of the device, the first portion of data at the first modified buffer offset.

12. The system of claim 11, wherein the first portion of prefetched data occurs at a beginning of the partial reconfiguration data.

13. The system of claim 12, wherein a first size of the first portion of prefetched data is larger than a second size of the second portion of prefetched data.

14. The system of claim 11, wherein providing the first modified buffer offset occurs after a plurality of reads to external memory have been performed.

15. The system of claim 14, wherein a first size of the first portion of prefetched data is the same as a second size of the second portion of prefetched data.

16. The system of claim 11, wherein the second modified buffer offset is based on an amount of time that the programmable logic device will lose ownership of a bus to the external memory after reading the first portion of data at the first modified buffer offset.

17. The system of claim 10, wherein a total size of the partial reconfiguration data is larger than a size of the local buffer memory.

18. The system of claim 10, wherein writing the first portion of prefetched data stored in local buffer memory occurs in a gap between requesting the first modified buffer offset and receiving the first portion of data at the first modified buffer offset.

* * * * *